United States Patent
Ito et al.

(10) Patent No.: US 9,133,300 B2
(45) Date of Patent: Sep. 15, 2015

(54) RESIN COMPOSITION FOR ADHESIVE, ADHESIVE CONTAINING RESIN COMPOSITION FOR ADHESIVE, ADHESIVE SHEET CONTAINING RESIN COMPOSITION FOR ADHESIVE, AND PRINTED WIRING BOARD INCLUDING ADHESIVE OR ADHESIVE SHEET AS ADHESIVE LAYER

(75) Inventors: Takeshi Ito, Otsu (JP); Shintaro Nanbara, Otsu (JP); Hiroko Asada, Otsu (JP); Yuto Tanikawa, Minato-ku (JP); Hideaki Tanaka, Minato-ku (JP); Yoichi Kenmotsu, Minato-ku (JP)

(73) Assignees: TOYO BOSEKI KABUSHIKI KAISHA, Osaka (JP); NIPPON MEKTRON, LTD., Tokyo (JP)

( * ) Notice: Subject to any disclaimer, the term of this patent is extended or adjusted under 35 U.S.C. 154(b) by 498 days.

(21) Appl. No.: 13/637,790

(22) PCT Filed: Apr. 12, 2011

(86) PCT No.: PCT/JP2011/059067
§ 371 (c)(1),
(2), (4) Date: Sep. 27, 2012

(87) PCT Pub. No.: WO2011/129323
PCT Pub. Date: Oct. 20, 2011

(65) Prior Publication Data
US 2013/0020118 A1    Jan. 24, 2013

(30) Foreign Application Priority Data

Apr. 14, 2010    (JP) ................................. 2010-092937

(51) Int. Cl.
| | | |
|---|---|---|
| *C09J 175/06* | (2006.01) | |
| *H05K 1/02* | (2006.01) | |
| *C08L 75/06* | (2006.01) | |
| *C08G 18/66* | (2006.01) | |
| *H05K 3/00* | (2006.01) | |
| *H05K 3/28* | (2006.01) | |
| *H05K 3/38* | (2006.01) | |

(52) U.S. Cl.
CPC ........... *C08G 18/6659* (2013.01); *C09J 175/06* (2013.01); *H05K 3/0058* (2013.01); *H05K 3/281* (2013.01); *H05K 3/386* (2013.01)

(58) Field of Classification Search
CPC ...... C09J 175/04; C09J 175/06; C09J 167/00; C09J 167/02; C09J 167/03; C09J 163/00
USPC ....................................................... 523/400
See application file for complete search history.

(56) References Cited

U.S. PATENT DOCUMENTS

| | | | |
|---|---|---|---|
| 3,170,833 A | * | 2/1965 | Noyes ............................ 428/416 |
| 5,518,571 A | * | 5/1996 | Puerkner et al. ............... 156/332 |
| 6,194,523 B1 | | 2/2001 | Murata et al. |
| 2002/0143133 A1 | * | 10/2002 | Imai et al. ......................... 528/44 |

FOREIGN PATENT DOCUMENTS

| | | |
|---|---|---|
| JP | 8-120250 | 5/1996 |
| JP | 11-116930 | 4/1999 |
| JP | 2003-27030 | 1/2003 |
| JP | 2005-60607 | 3/2005 |
| JP | 2007-204715 | 8/2007 |
| JP | 2008-19375 | 1/2008 |
| JP | 2008-205370 | 9/2008 |
| JP | 2009-84348 | 4/2009 |
| JP | 2010-84005 | 4/2010 |
| JP | 4978753 | 7/2012 |
| WO | 2010/038733 | 4/2010 |

OTHER PUBLICATIONS

Machine Translation of WO 2010038733 A1.*
International Search Report issued Jul. 26, 2011 in International (PCT) Application No. PCT/JP2011/059067.
Notice of Allowance issued Jan. 13, 2015 in corresponding Japanese Application No. 2012-510658 (with English translation).

* cited by examiner

*Primary Examiner* — Mike M Dollinger
(74) *Attorney, Agent, or Firm* — Wenderoth, Lind & Ponack, L.L.P.

(57) ABSTRACT

Provided is a resin composition for an adhesive comprising a polyurethane resin containing a carboxyl group, having specific range of an acid value having specific range of a number average molecular weight and having specific range of a glass transition temperature a polyester resin having specific range of a number average molecular weight and having specific range of a glass transition temperature; an epoxy resin containing a nitrogen atom; and an epoxy resin having a dicyclopentadiene skeleton, in which a content rate of the polyurethane resin to a sum of the polyurethane resin and the polyester resin is 70 to 95 percent by mass, a content rate of the total epoxy resin contained in the resin composition to the sum of the polyurethane resin and the polyester resin is 5 to 30 percent by mass.

8 Claims, No Drawings

RESIN COMPOSITION FOR ADHESIVE, ADHESIVE CONTAINING RESIN COMPOSITION FOR ADHESIVE, ADHESIVE SHEET CONTAINING RESIN COMPOSITION FOR ADHESIVE, AND PRINTED WIRING BOARD INCLUDING ADHESIVE OR ADHESIVE SHEET AS ADHESIVE LAYER

TECHNICAL FIELD

The present invention relates to a resin composition that is excellent in adhesiveness to various types of plastic films, adhesiveness to metal such as copper, aluminum and stainless steel, adhesiveness to glass epoxy, heat resistance, moisture resistance, and allows an excellent sheet life and the like; an adhesive containing the resin composition; an adhesive sheet containing the resin composition; and a printed wiring board including the adhesive or the adhesive sheet as an adhesive layer.

BACKGROUND ART

While adhesives are used in various fields in recent years, diversification of the purpose of use requires further improvement in adhesiveness to various types of plastic films, adhesiveness to metal such as copper, aluminum and stainless steel, adhesiveness to glass epoxy, heat resistance, moisture resistance, a sheet life and the like, as compared with the conventionally used adhesives. For example, adhesives for circuit boards including a flexible printed wiring board (which may be hereinafter abbreviated as FPC) are required to have adhesiveness, processability, electrical characteristics, and preservability. For these applications, an epoxy/acrylic butadiene-based adhesive, an epoxy/polyvinyl butyral-based adhesive and the like have been conventionally used.

Particularly, with the recent tendency of the increased density of the wiring and the multilayered flexible printed wiring board, it is strongly required to improve adhesiveness at a high temperature and high humidity. The conventional epoxy/acrylic butadiene-based adhesive and epoxy/polyvinyl butyral-based adhesive were poor particularly in adhesiveness and processability at a high temperature and high humidity, and also insufficient in adhesiveness to metal and plastic films. Also, the stabilized sheet life that can be put into circulation even at ordinary temperatures could not be ensured.

For the above-described problems, a resin composition for an adhesive containing specific polyester polyurethane and an epoxy resin as main components is proposed, for example, in Japanese Patent Laying-Open No. 11-116930 (PTL 1), Japanese Patent Laying-Open No. 2008-205370 (PTL 2), Japanese Patent Laying-Open No. 2007-204715 (PTL 3), and the like. Although it is recognized that the compositions disclosed in PTL 1 can improve the adhesiveness at a high temperature, the adhesiveness at a high temperature and high humidity is still insufficient. According to the composition disclosed in PTL 1, the reaction between the carboxyl group and the epoxy group in the polyurethane resin gradually progresses even at ordinary temperatures, which causes a problem that the sheet life is shortened. Although the composition disclosed in PTL 2 allows improvement in the adhesiveness at a high temperature and high humidity and in the solder resistance to humidification at the time when a plastic film is used as a reinforcing plate, this composition cannot sufficiently improve the solder resistance to humidification at the time when metal is used as a reinforcing plate. Furthermore, the composition disclosed in PTL 2 causes significant decreases in the solder resistance to humidification after storage each at an ordinary temperature and at 40° C. and also in the adhesiveness at a high temperature and high humidity, so that the stabilized sheet life could not be ensured. In PTL 3, the glass transition temperature of the polyurethane resin was raised to successfully improve the adhesiveness and the sheet life at a high temperature. However, raising the glass transition temperature inevitably causes reduction in flexibility of the adhesive layer. Consequently, when the adhesive sheet is cut/punched and when it is peeled off from the release sheet in the manufacturing process of the flexible printed wiring board, the adhesive sheet may be cracked or exfoliated, which leads to a disadvantage that the processing suitability becomes insufficient. Furthermore, the composition disclosed in PTL 3 was insufficient also in adhesiveness at a high temperature and high humidity.

In addition, Japanese Patent Laying-Open No. 2008-019375 (PTL 4) and Japanese Patent Laying-Open No. 2009-084348 (PTL 5) each disclose an adhesive composition into which two types of polyester resins having different glass transition temperatures are blended. According to these adhesive compositions, although the processing suitability at a room temperature can be improved by blending the polyester resin having a relatively high glass transition temperature and the polyester resin having a relatively low glass transition temperature, the flexibility is relatively low on the condition of not more than 5° C. at which the adhesive sheet is generally stored. Thus, satisfactory processability could not be achieved at a low temperature. Furthermore, since the polyester resin is less in cohesive force than the polyurethane resin, the polyester resin is inferior in adhesiveness and heat resistance while the outflow amount is also increased during the pressing process, thereby leading to a disadvantage that the base material is contaminated.

CITATION LIST

Patent Literature

PTL 1: Japanese Patent Laying-Open No. 11-116930
PTL 2: Japanese Patent Laying-Open No. 2008-205370
PTL 3: Japanese Patent Laying-Open No. 2007-204715
PTL 4: Japanese Patent Laying-Open No. 2008-019375
PTL 5: Japanese Patent Laying-Open No. 2009-084348

SUMMARY OF INVENTION

Technical Problem

The present invention aims to solve various problems associated with the above-described conventional adhesives, and also aims to provide an adhesive that is excellent in heat and humidity resistance adaptable to lead-free solder at high humidity, excellent in adhesiveness at a high temperature and high humidity, and excellent in processing suitability during use while maintaining the adhesiveness to various plastic films, metal such as copper, aluminum and stainless steel, and glass epoxy, and to provide an adhesive sheet made of the above-described adhesive, having a relatively long sheet life and allowing the excellent adhesive properties to be maintained even if it is used after having been put into circulation at a high temperature and high humidity. Furthermore, the present invention also aims to provide a printed wiring board including an adhesive layer made of the above-described adhesive or adhesive sheet.

Solution to Problem

As a result of an earnest study for solving the above-described problems, the present inventors have come to complete the present invention. The present invention includes the following configurations.

A resin composition for an adhesive of the present invention comprises a polyurethane resin (a-1) containing a carboxyl group, having an acid value (unit: equivalent/$10^6$ g) of not less than 100 and not more than 1000, having a number average molecular weight of not less than $5.0 \times 10^3$ and not more than $1.0 \times 10^5$, and having a glass transition temperature of 30° C. or more and 80° C. or less; a polyester resin (a-2) having a number average molecular weight of not less than $5.0 \times 10^3$ and not more than $1.0 \times 10^5$ and having a glass transition temperature of 0° C. or less; an epoxy resin (b) containing a nitrogen atom; and an epoxy resin (c) having a dicyclopentadiene skeleton. The resin composition for an adhesive is characterized in that a content rate of the polyurethane resin (a-1) to a sum of the polyurethane resin (a-1) and the polyester resin (a-2) is not less than 70 percent by mass and not more than 95 percent by mass; a content rate of the total epoxy resin contained in the resin composition to the sum of the polyurethane resin (a-1) and the polyester resin (a-2) is not less than 5 percent by mass and not more than 30 percent by mass; and a blending ratio of the epoxy resin (b) is not less than 0.1 percent by mass and not more than 20 percent by mass of the total epoxy resin contained in the resin composition (which may be hereinafter simply referred to as a "resin composition").

According to the resin composition for an adhesive of the present invention, it is preferable that the epoxy resin (b) has a glycidyl diamine structure.

According to the resin composition for an adhesive of present invention, it is preferable that the blending ratio of the epoxy resin (c) is not less than 60 percent by mass and not more than 99.9 percent by mass of the total epoxy resin contained in the resin composition.

According to the resin composition for an adhesive of the present invention, it is preferable that the polyurethane resin (a-1) is obtained by a reaction of polyester polyol (d), a compound (e) having one carboxylic acid group and two hydroxyl groups, and polyisocyanate (f).

It is preferable that the resin composition for an adhesive of the present invention further contains an organic solvent.

The present invention also provides an adhesive containing the resin composition of the present invention as described above.

The present invention also provides an adhesive sheet containing the resin composition of the present invention as described above.

The present invention also provides a printed wiring board including an adhesive layer made of the resin composition of the present invention as described above.

Advantageous Effects of Invention

According to the present invention, it becomes possible to implement an adhesive that is excellent in adhesiveness to various plastic films, excellent in adhesiveness to metal such as copper, aluminum and stainless steel, excellent in adhesiveness to glass epoxy, excellent in adhesiveness at a high temperature and high humidity, and excellent in processing suitability during production, and also possible to provide a resin composition allowing an adhesive sheet to have a relatively long life, an adhesive containing the resin component, an adhesive sheet containing the resin composition, and a printed wiring board including the adhesive or the adhesive sheet as an adhesive layer.

DESCRIPTION OF EMBODIMENTS

The resin composition for an adhesive of the present invention may consist of a specific polyurethane resin (a-1), a specific polyester resin (a-2), a specific epoxy resin (b), and a specific epoxy resin (c), and also may contain an organic solvent.

The number average molecular weight of the polyurethane resin (a-1) used in the present invention is not less than $5.0 \times 10^3$ to $1.0 \times 10^5$. When the number average molecular weight of the polyurethane resin (a-1) is less than $5.0 \times 10^3$, the adhesiveness immediately after application thereof is insufficient to thereby deteriorate workability, and also, the flexibility tends to be reduced to decrease the adhesiveness. When the number average molecular weight of the polyurethane resin (a-1) exceeds $1.0 \times 10^5$, the solution viscosity during application of the resin is too high so that a uniform coating film may not be able to be achieved. The lower limit value of the number average molecular weight of the polyurethane resin (a-1) is preferably $8.0 \times 10^5$, and further preferably $1.0 \times 10^4$. Furthermore, the upper limit value of the number average molecular weight of the polyurethane resin (a-1) is preferably $5.0 \times 10^4$, and further preferably $3.5 \times 10^4$.

The acid value (unit: equivalent/$10^6$ g) of the polyurethane resin (a-1) used in the present invention is not less than 100 and not more than 1000. When the acid value of the polyurethane resin (a-1) is less than 100 equivalents/$10^6$ g, adhesiveness to the metal base material tends to be insufficient. Also, crosslinking to the epoxy resin is also insufficient, so that the heat resistance tends to be decreased. When the acid value of the polyurethane resin (a-1) exceeds 1000 equivalents/$10^6$ g, there is a tendency that the storage stability of varnish dissolved in the solvent is lowered and the crosslink reaction of the adhesive sheet is facilitated at ordinary temperatures, with the result that the stabilized sheet life cannot be achieved. Furthermore, crosslinking to the epoxy resin tends to be excessively dense, thereby deteriorating the adhesiveness. The lower limit of the acid value of the polyurethane resin (a-1) is preferably 150 equivalents/$10^6$ g, more preferably 200 equivalents/$10^6$ g, and further preferably 400 equivalents/$10^6$ g. The upper limit of the acid value of the polyurethane resin (a-1) is preferably 900 equivalents/$10^6$ g, more preferably 800 equivalents/$10^6$ g, further preferably 700 equivalents/$10^6$ g. Examples of the method of introducing the acid value includes a method of copolymerizing multifunctional carboxylic acid having not less than three functions with polyester polyol forming polyurethane, a method of using diol containing carboxylic acid for a chain extender, and the like.

The glass transition temperature of the polyurethane resin (a-1) used in the present invention is 30° C. or more and 80° C. or less. When the glass transition temperature is less than 30° C., the adhesiveness tends to be insufficient at a high temperature and high humidity. When the glass transition temperature exceeds 80° C., there is a tendency that bonding to the base material cannot be sufficiently achieved while the modulus of elasticity is increased at ordinary temperatures, thereby leading to insufficient adhesiveness at ordinary temperatures. The lower limit of the glass transition temperature is preferably 35° C., and more preferably 40° C. The upper limit of the glass transition temperature is preferably 75° C., and more preferably 70° C.

It is preferable that the raw materials of the polyurethane resin (a-1) used in the present invention are polyester polyol (d), polyisocyanate (f) and a chain extender.

The number average molecular weight of the above-described polyester polyol (d) is preferably not less than 2000 and not more than 50000, and more preferably not less than 6000 and not more than 35000. When the number average molecular weight is less than 2000, the number of the urethane bonds within a molecule is excessively increased, so that the heat resistance of the solder is lowered while the adhesiveness is also deteriorated. In contrast, when the number average molecular weight exceeds 50000, the distance between the epoxy resin and the cross-linking point is excessively increased, so that the heat resistance of the solder is lowered.

As to the above-described polyester polyol (d), assuming that the sum of the total acid components constituting polyester polyol (d) is 100 mol %, the aromatic acid is preferably not less than 30 mol %, more preferably not less than 45 mol %, and further preferably not less than 60 mol %. When the aromatic acid is less than 30 mol %, the cohesive force of the coating film is relatively weak, so that reduction in the strength of adhesion to various base materials is recognized.

Examples of aromatic acids may include aromatic dicarboxylic acid such as terephthalic acid, isophthalic acid, ortho-phthalic acid, naphthalene dicarboxylic acid, biphenyl dicarboxylic acid, diphenic acid, and 5-hydroxy isophthalic acid. Furthermore, examples of aromatic acids may also include sulfoterephthalic acid, 5-sulfoisophthalic acid, 4-sulfophthalic acid, 4-sulfonaphthalene 2,7-dicarboxylic acid, 5-(4-sulfophenoxy)isophthalic acid; and metal salts thereof, ammonium salt, for example, aromatic dicarboxylic acid having a sulfonic acid group or sulfonic acid base; aromatic oxycarboxylic acid such as p-hydroxybenzoic acid, p-hydroxyphenyl propionic acid, p-hydroxyphenyl acetic acid, 6-hydroxy-2-naphthoic acid, and 4,4-bis(p-hydroxyphenyl) valeric acid. Among these, terephthalic acid, isophthalic acid and a mixture thereof are particularly preferable since the cohesive force of the coating film can be increased.

Examples of other acid components may include alicyclic dicarboxylic acid such as 1,4-cyclohexanedicarboxylic acid, 1,3-cyclohexanedicarboxylic acid, and 1,2-cyclohexanedicarboxylic acid; and aliphatic dicarboxylic acid such as succinic acid, adipic acid, azelaic acid, sebacic acid, dodecanedioic acid, and dimer acid.

In addition, it is preferable that the glycol component consists of aliphatic glycol, alicyclic glycol, aromatic-containing glycol, ether linkage-containing glycol, and the like. Examples of aliphatic glycol may include ethylene glycol, 1,2-propylene glycol, 1,3-propanediol, 1,4-butanediol, 2-methyl-1,3-propanediol, 1,5-pentanediol, neopentyl glycol, 1,6-hexanediol, 3-methyl-1,5-pentanediol, 1,9-nonanediol, 2-ethyl-2-butyl-1,3-propanediol, hydroxypivalic acid neopentyl glycol ester, dimethylol heptane, 2,2,4-trimethyl-1,3-pentanediol, and the like. Examples of alicyclic glycol may include 1,4-cyclohexanediol, 1,4-cyclohexane dimethanol, tricyclodecanediol, tricyclodecane dimethylol, spiroglycol, hydrogenated bisphenol A, an ethylene oxide adduct and a propylene oxide adduct of hydrogenated bisphenol A, and the like. Examples of ether-linkage containing glycol may include diethylene glycol, triethylene glycol, dipropylene glycol, and further, polyethylene glycol, polypropylene glycol, polytetramethylene glycol, a neopentyl glycol ethylene oxide adduct, a neopentyl glycol propylene oxide adduct, and the like. Examples of aromatic-containing glycol may include glycols obtained by adding one to several moles of ethylene oxide or propylene oxide to two phenolic hydroxyl groups of bisphenols, such as paraxylene glycol, meta-xylene glycol, ortho-xylene glycol, 1,4-phenylene glycol, an ethylene oxide adduct of 1,4-phenylene glycol, bisphenol A, an ethylene oxide adduct and a propylene oxide adduct of bisphenol A.

Furthermore, the oxycarboxylic acid compound having a molecular structure including a hydroxyl group and a carboxyl group can also be used as polyester raw material. Examples thereof may include 5-hydroxy isophthalic acid, p-hydroxybenzoic acid, p-hydroxyphenyl propionic acid, p-hydroxyphenyl acetic acid, 6-hydroxy-2-naphthoic acid, 4,4-bis(p-hydroxyphenyl)valeric acid, and the like.

In polyester polyol (d) used in the present invention, assuming that the sum of the total acid components or total glycol components constituting polyester polyol (d) is 100 mol %, polycarboxylic acid group of not less than three functions and/or polyols of not less than three functions within the range of not less than 0.1 mol % and not more than 5 mol % may be copolymerized, for the purpose of introducing a branched skeleton. Since an epoxy resin is blended into the resin composition for an adhesive of the present invention, introduction of a branched skeleton causes an increase in the terminal group of the resin (a-1), that is, the functional group capable of reacting with the cross-linking agent, so that a coating film having a high crosslink density and high strength can be achieved. Examples of polycarboxylic acid having not less than three functions and showing the above-described effects may include compounds such as trimellitic acid, trimesic acid, ethylene glycol-bis(anhydrotrimellitate), glyceroltris(anhydrotrimellitate), trimellitic anhydride, pyromellitic anhydride (PMDA), oxydiphthalic dianhydride (ODPA), 3,3',4,4'-benzophenone tetracarboxylic dianhydride (BTDA), 3,3',4,4'-diphenyl tetracarboxylic dianhydride (BPDA), 3,3',4,4'-diphenyl sulfone tetracarboxylic dianhydride (DSDA), 4,4'-(hexafluoroisopropylidene) diphthalic dianhydride (6FDA), and 2,2'-bis[(dicarboxyphenoxy)phenyl]propane dianhydride (BSAA). Examples of polyol of not less than three functions may include glycerin, trimethylol ethane, trimethylol propane, pentaerythritol, and the like. When using polycarboxylic acid of not less than three functions and/or polyol of not less than three functions, it is convenient to conduct copolymerization within the range of not less than 0.1 mol % and not more than 5 mol %, preferably not less than 0.1 mol % and not more than 3 mol %, with respect to the total acid component or total glycol component. When exceeding 5 mol %, the dynamic physical properties such as elongation at breakage of the coating film may deteriorate, and also, gelation may occur during polymerization.

For the purpose of introducing a carboxyl group as required, acid can be added to polyester polyol (d) used in the present invention within the range of not less than 0.1 mol % and not more than 10 mol %. When monocarboxylic acid, dicarboxylic acid and a polyfunctional carboxylic compound are used for acid addition, ester interchange causes a decrease in the molecular weight, and therefore, it is preferable to use acid anhydride. Examples of acid anhydride may include compounds such as succinic anhydride, maleic anhydride, phthalic anhydride, 2,5-norbornene dicarboxylic anhydride, tetrahydrophthalic anhydride, trimellitic anhydride, pyromellitic anhydride (PMDA), oxydiphthalic dianhydride (ODPA), 3,3',4,4'-benzophenone tetracarboxylic dianhydride (BTDA), 3,3',4,4'-diphenyl tetracarboxylic dianhydride (BPDA), 3,3',4,4'-diphenylsulfone tetracarboxylic dianhydride (DSDA), 4,4'-(hexafluoroisopropylidene)diphthalic dianhydride (6FDA), 2,2'-bis[(dicarboxyphenoxy)phenyl] propane dianhydride (BSAA). Assuming that the total acid component constituting polyester polyol (d) used in the present invention is 100 mol %, acid addition of not less than 10 mol % may cause gelation and also cause depolymerization of polyester, thereby reducing the resin molecular weight. Examples of the method of conducting acid addition may include a method of directly conducting acid addition in a bulk state after polyester polycondensation and a method of bringing polyester into a solution for addition. The reaction occurring in the bulk state progresses at a relatively higher speed, but may cause gelation when a large amount of polyester is added. In addition, since the reaction occurs at a high temperature, it is necessary to pay attention, for example, so as to block oxygen gas to prevent oxidation. On the other hand, the addition in the solution state allows stabilized introduction of a large amount of carboxyl groups, though the reaction rate is relatively slow.

Polyisocyanate (f) used for producing a polyurethane resin (a-1) used in the present invention may be one of diisocyanate, a dimer thereof (uretdione), a trimer thereof (isocyanurate, a triol adduct, a burette), or a mixture of two or more of them. For example, a diisocyanate component may be 2,4-trilene diisocyanate, 2,6-trilene diisocyanate, p-phenylene diisocyanate, diphenylmethane diisocyanate, m-phenylene diisocyanate, hexamethylene diisocyanate, tetra-methylene diisocyanate, 3,3'-dimethoxy-4,4'-biphenylene diisocyanate, 1,5-naphthalene diisocyanate, 2,6-naphthalene diisocyanate, 4,4'-diisocyanate diphenyl ether, 1,5-xylylene diisocyanate, 1,3-diisocyanate methylcyclohexane, 1,4-diisocyanate methylcyclohexane, 4,4'-diisocyanate cyclohexane, 4,4'-diisocyanate cyclohexyl methane, isophorone diisocyanate, dimer acid diisocyanate, norbornane diisocyanate, and the like. In light of xanthochroism, it is preferable to employ aliphatic/alicyclic diisocyanate. Furthermore, it is particularly preferably to employ hexamethylene diisocyanate and isophorone diisocyanate for reasons of availability and economy.

A chain extender may be used as required when producing the polyurethane resin (a-1) used in the present invention. Examples of the chain extender may be a compound (e) having one carboxylic acid and two hydroxyl groups such as low-molecular weight diol, dimethylol propionic acid and dimethylol butanoic acid that have been already described as a constituent of polyester polyol (d). Particularly, it is preferable to employ dimethylol butanoic acid since it allows easy introduction of an acid value and it is soluble in a general-purpose solvent. It is also preferable to employ trimethylol propane since it allows easy introduction of a hydroxyl group.

As the method of producing a polyurethane resin (a-1) used in the present invention, the above-described polyester polyol (d), polyisocyanate (f) and, if necessary, the above-described chain extender may be collectively or separately introduced into a reaction container. In any case, as to polyester polyol, the sum of hydroxyl values of the chain extender and the sum of isocyanate groups of polyisocyanate within the system, the reaction is caused to occur in the state where the ratio of the functional groups between the isocyanate group and the hydroxyl group is not more than 1. Furthermore, this reaction can be produced by causing a reaction in the presence or absence of an inactive solvent for an isocyanate group. Examples of this solvent may be an ester-based solvent (ethyl acetate, butyl acetate, ethyl butyrate, and the like), an ether-based solvent (dioxane, tetrahydrofuran, diethyl ether, and the like), a ketone-based solvent (cyclohexanone, methyl ethyl ketone, methyl isobutyl ketone, and the like), an aromatic hydrocarbon-based solvent (benzene, toluene, xylene, and the like), and a solvent mixture thereof. For the purpose of reducing environmental burdens, it is preferable to employ ethyl acetate and methyl ethyl ketone. The reactor to be used may be not only a reaction can provided in a stirring apparatus but also a mixing and kneading apparatus such as a kneader and a twin screw extruder.

In order to promote the urethane reaction, the catalyst used in the normal urethane reaction, for example, a tin-based catalyst (trimethyltin laurate, dimethyltin laurate, trimethyltin hydroxide, dimethyltin dihydroxide, stannous octoate, and the like), a lead-based catalyst (lead oleate, lead 2-ethyl hexoate, and the like), an amine-based catalyst (triethylamine, tributylamine, morpholine, diazabicyclo octane, diazabicyclo-undecene, and the like). It is preferable to employ an amine-based catalyst in consideration of harmful effects.

It is preferable that the number average molecular weight of the polyester resin (a-2) used in the present invention is not less than $5.0 \times 10^3$ and not more than $1.0 \times 10^5$. When the number average molecular weight of the polyester resin (a-2) is less than $5.0 \times 10^3$, the mechanical strength of the adhesive tends to decrease, thereby causing deterioration in the heat resistance and adhesiveness. When the number average molecular weight exceeds $1.0 \times 10^5$, the solution viscosity becomes so high during application that a uniform coating film may not be achieved. The lower limit value of the number average molecular weight of the polyester resin (a-2) is preferably $8.0 \times 10^5$, and further preferably $1.0 \times 10^4$. Furthermore, the upper limit value of the number average molecular weight of the polyester resin (a-2) is preferably $5.0 \times 10^4$, and further preferably $3.5 \times 10^4$.

The glass transition temperature of the polyester resin (a-2) used in the present invention is 0° C. or less. When the glass transition temperature exceeds 0° C., the adhesive sheet tends to become hard and brittle, which may cause cracking in the adhesive sheet during production, thereby deteriorating workability. Furthermore, the adhesive tends to become hard, so that the adhesiveness may be insufficient. The glass transition temperature is preferably −5° C. or less, and more preferably −10° C. or less.

As an acid component and a glycol component used for the polyester resin (a-2) in the present invention, it is possible to suitably use the compound similar to that recited as an acid component and a glycol component that are used for the above-described polyester polyol (d). Examples of the method of setting the glass transition temperature of the polyester resin (a-2) at 0° C. or less may include a method of copolymerizing aliphatic dicarboxylic acid, a method of copolymerizing long chain glycol, a method of copolymerizing polyalkylene glycol, and a method of copolymerizing lactone.

Examples of aliphatic carboxylic acid may include succinic acid, adipic acid, azelaic acid, sebacic acid, dodecanedioic acid, dimer acid, and the like. Examples of long chain glycol may include nonanediol, decanediol, dimer acid diol, and the like. Examples of polyalkylene glycol may be diethylene glycol, triethylene glycol, dipropylene glycol, and further, polyethylene glycol, polypropylene glycol, polytetramethylene glycol, and the like. Examples of lactone may be β-propiolactone, γ-butyrolactone, δ-valerolactone, ε-caprolactone, and the like. Among the examples of lactone, ε-caprolactone is preferable for reasons of availability and economy. As a copolymerization method, it is preferable to employ the method of introducing lactone monomers in the bulk state after polycondensation for ring-opening polymerization with a polyester resin.

According to the resin composition of the present invention, the polyurethane resin (a-1) and the polyester resin (a-2) are blended in the proportion of 95/5 to 70/30, preferably 95/5 to 80/20, more preferably 93/7 to 85/15 in mass ratio. When the blending amount of the polyester resin (a-2) is greater than 30 percent by mass, the adhesiveness tends to deteriorate at a room temperature and a high temperature, and also at a high temperature and high humidity. When the blending amount of the polyester resin (a-2) is less than 5 percent by mass, the adhesive sheet tends to become hard and brittle, so that the adhesive sheet tends to crack during production to thereby deteriorate workability.

The resin composition of the present invention requires an epoxy resin (b) containing a nitrogen atom. When the resin composition of the present invention is brought into a semi-cured state, the outflow amount of the adhesive sheet during the pressing process can be suppressed, which allows a significant improvement in the problems such as product contamination and the defective rate. When the resin composition of the present invention contains the epoxy resin containing a nitrogen atom, the coating film of the resin composition of the present invention can be brought into a semi-cured state (B stage state) by heating at a relatively low temperature for a relatively short period of time. Accordingly, the workability is significantly improved. Examples of the epoxy resin (b) containing a nitrogen atom may be glycidyl amine such as tetraglycidyl diaminodiphenylmethane, triglycidyl-para-aminophenol, tetraglycidyl-bis-aminomethyl cyclohexanone, and N,N,N',N'-tetraglycidyl-m-xylene diamine. The blending amount of the epoxy resin (b) containing these nitrogen atoms is not less than 0.1 percent by mass and not more than 20 percent by mass of the total epoxy resin. When the blending amount of the epoxy resin (b) is less than 0.1 percent by mass, prolonged heating is required for bringing the coating film of the resin composition into a semi-cured state, which may deteriorate workability. When the blending amount of the epoxy resin (b) is greater than 20 percent by mass, stiffness is excessively increased so that the adhesiveness tends to deteriorate. In addition, the progress of the crosslink reaction is facilitated during storage, thereby shortening the sheet life. The lower limit of the blending amount of the epoxy resin (b) is preferably 1 percent by mass, and more preferably 2 percent by mass. The upper limit of the blending amount of the epoxy resin (b) is preferably 10 percent by mass, and more preferably 5 percent by mass.

The resin composition of the present invention inevitably requires an epoxy resin (c) having a dicyclopentadiene skeleton. The cured coating film made of the epoxy resin having a bulky dicyclopentadiene skeleton has excessively low moisture absorptivity, and allows reduction in the crosslink density of the cured coating film to alleviate the stress during peeling from the base material. Consequently, the adhesiveness is further improved at high humidity. The blending amount of the epoxy resin having a dicyclopentadiene skeleton is preferably not less than 60 percent by mass, more preferably not less than 75 percent by mass, further preferably not less than 90 percent by mass of the total epoxy resin. When the resin composition contains not less than 60 percent by mass of an epoxy resin having a dicyclopentadiene skeleton, more excellent adhesiveness can be achieved at a high temperature and high humidity.

Other epoxy can also be used in combination as an epoxy resin blended into the resin composition for an adhesive of the present invention. Examples of epoxy may be a glycidyl ether type such as bisphenol A diglycidyl ether, bisphenol S diglycidyl ether, novolak glycidyl ether, bromized bisphenol A diglycidyl ether; a glycidyl ester type such as hexahydrophthalic glycidyl ester and dimer acid glycidyl ester; or alicyclic or aliphatic epoxide such as 3,4-epoxy cyclohexyl methyl carboxylate, epoxidized polybutadiene and epoxidized soybean oil. The blending amount of the total epoxy resin blended into the resin composition of the present invention is not less than 5 parts by mass and not more than 30 parts by mass with respect to the total 100 parts by mass of the above-described polyurethane resin (a-1) and the above-described polyester resin (a-2). When the blending amount of the total epoxy resin is less than 5 parts by mass with respect to the total 100 parts by mass of the above-described polyurethane resin (a-1) and the above-described polyester resin (a-2), the cross-linking tends to be insufficient, thereby causing deterioration in heat resistance. When the blending amount of the total epoxy resin is greater than 30 parts by mass, a large amount of unreacted epoxy resin tends to remain, thereby deteriorating the heat resistance and moisture resistance.

A curing catalyst can be used for the curing reaction of the epoxy resin used in the present invention. Examples of the curing catalyst may be an imidazole-based compound such as 2-methyl imidazole, 1,2-dimethyl imidazole, 2-ethyl-4-methyl imidazole, 2-phenyl-4-methyl imidazole, and 1-cyanoethyl-2-ethyl-4-methyl imidazole; tertiary amines such as triethylamine, triethylene diamine, N'-methyl-N-(2-dimethylamino ethyl)piperazine, 1,8-diazabicyclo(5,4,0)-undecene-7,1,5-diazabicyclo(4,3,0)-nonen-5,6-dibutyl amino-1,8-diazabicyclo(5,4,0)-undecene-7; and a compound obtained by bringing these tertiary amines into amine salt using phenol, octylic acid, quaternized tetraphenylborate salt, and the like; a cation catalyst such as triallyl sulfonium hexafluoroantimonate and diallyl iodonium hexafluoroantimonate; triphenylphosphine, and the like. Among them, in terms of the thermosetting properties and heat resistance, adhesiveness to metal and storage stability after blending, it is preferable to employ tertiary amines such as 1,8-diazabicyclo (5,4,0)-undecene-7,1,5-diazabicyclo(4,3,0)-nonen-5,6-dibutyl amino-1,8-diazabicyclo(5,4,0)-undecene-7; and a compound obtained by bringing these tertiary amines into amine salt using phenol, octylic acid, quaternized tetraphenyl borate salt, and the like. It is preferable that the blending amount in this case is not less than 0.01 parts by mass and not more than 1.0 parts by mass with respect to 100 parts by mass of the polyurethane resin (a-1). In this range of the blending amount, it becomes possible to further enhance the effect on the reaction between the polyurethane resin (a-1) and the epoxy compound, so that strong adhesiveness can be achieved.

The resin composition of the present invention can be blended as appropriate with hindered amine-based, hindered phenol-based and phosphorus-based antioxidants; bromine-based, phosphorus-based, nitrogen-based, and metal oxide compound-based flame retardants; additives such as a leveling agent, pigments and dyes.

The resin composition for an adhesive of the present invention is not limited to one solution type, but may be a multi-agent mixing-type resin composition for an adhesive that is obtained by mixing a plurality of separate agents before use. In the case of the multi-agent mixing-type resin composition, it is necessary to uniformly mix the plurality of agents in an accurate blending ratio when it is used as an adhesive. Consequently, the greater the number of agents is, the more the process becomes complicated. Therefore, it is preferable to select a two-agent mixing type or three-agent mixing type among the multi-agent mixing type. Preferable examples of the two-agent mixing type may be two agents including an agent made of a polyurethane resin (a-1), a polyester resin (a-2) and an organic solvent, and an agent made of an epoxy resin (b) containing a nitrogen atom, an epoxy resin (c) having a dicyclopentadiene skeleton and an organic solvent. Furthermore, preferable examples of the three-agent mixing type may be three agents including an agent made of a polyurethane resin (a-1) and an organic solvent; an agent made of a polyester resin (a-2) and an organic solvent; and an agent made of an epoxy resin inorganic filler (b) containing a nitrogen atom, an epoxy resin (c) having a dicyclopentadiene skeleton and an organic solvent. It is needless to say that an organic solvent may not be used in a part or all of the agents in the above-described two-agent or three-agent mixing-type adhesive composition.

In the present invention, the adhesive sheet is made of a base material and a resin composition of the present invention, or a base material, a resin composition of the present invention and a release base material. The adhesive sheet has a function of bonding, by the resin composition of the present invention, the base material to the material to be bonded. After being bonded, the base material of the adhesive sheet serves as a protection layer of this bonded material. When the release base material is used as a base material of the adhesive sheet, the release base material can be released and the adhesive layer can be transferred onto a still another material to be bonded.

In accordance with the commonly used method, the resin composition of the present invention is applied to various base materials and dried, with the result that the adhesive sheet of the present invention can be achieved. Furthermore, when the release base material is affixed onto the adhesive layer after dry, this adhesive layer can be taken up without causing offset onto the base material, thereby allowing excellent operability while protecting the adhesive layer, so that excellent preservability and easy usage can be achieved. After the resin composition is applied and dried, another release base material is affixed thereon as required, which also allows the adhesive layer itself to be transferred onto another base material. Furthermore, it is preferable that the adhesive sheet is in a semi-cured state (B stage state) in which at least a part of the resin composition of the present invention is reacted. This semi-cured state allows reduction in the outflow amount of the adhesive sheet during the pressing process, so that product contamination and increased defective rate can be prevented.

In this case, although the base material on which the resin composition of the present invention is applied is not particularly limited, it may be a film-shaped resin, a metal plate, metal foil, paper and the like. Examples of film-shaped resin may be a polyester resin, a polyamide resin, a polyimide resin, a polyamide-imide resin, an olefin-based resin, and the like. Examples of materials of the metal plate and metal foil may include various types of metals such as SUS, copper, aluminum, iron, and zinc, and alloys thereof, a plated product, and the like. Examples of paper may include high-quality paper, haft paper, roll paper, glassine paper, and the like. Examples of composite material may include glass epoxy and the like. In light of the durability and the strength of adhesion to the resin composition of the present invention, the base material on which the resin composition of the present invention is applied is preferably a polyester resin, a polyamide resin, a polyimide resin, a polyamide-imide resin, an SUS steel plate, copper foil, aluminum foil, and glass epoxy.

The release base material on which the resin composition of the present invention is applied is not particularly limited, but may be, for example, the material obtained by applying a silicone-based, fluorine-based or alkyd-based release agent onto each coating layer made of a sealer such as clay, polyethylene and polypropylene provided on both sides of paper such as high-quality paper, haft paper, roll paper and glassine paper; and the material obtained by applying the above-described release agent on a polyethylene terephthalate film, various olefin films made of polyethylene, polypropylene, ethylene-α-olefin copolymer, a propylene-α-olefin copolymer, and the like. For the reason of the releasing force from the applied adhesive layer and the reason that silicone adversely affects the electrical characteristics, it is preferable to employ the material obtained by applying an alkyd-based release agent on both sides of high-quality paper subjected to a polypropylene sealing process, and the material obtained by applying an alkyd-based release agent on polyethylene terephthalate.

In addition, the method of coating the resin composition of the present invention on the base material is not particularly limited, but may be a method of using a comma coater, a reverse roll coater or the like. Alternatively, an adhesive layer can also be disposed directly or by the transfer method on the rolled copper foil as a material of the printed wiring board or on the polyimide film, as required. Although the thickness of the dried adhesive layer may be suitably changed as appropriate, it is preferably within the range of not less than 5 μm and not more than 200 μm. The adhesive layer having a thickness of less than 5 μm is insufficient in adhesive strength. When the thickness of the adhesive layer exceeds 200 μm, the adhesive layer cannot be sufficiently dried, to cause an increase in the amount of remaining solvents. This causes a problem that bulging occurs during the pressing process of producing a printed wiring board. Although the drying condition is not particularly limited, the solvent remaining rate after dry is preferably not more than 1%. The solvent remaining rate after dry exceeding 1% causes a problem that foaming of the remaining solvent occurs during pressing the printed wiring board, thereby causing bulging.

The "printed wiring board" in the present invention includes a laminated body as a component that is made of metal foil forming a conductor circuit and a resin layer. The printed wiring board is produced, for example, by a conventionally well-known method such as a subtractive method using a metal-clad laminated body. The so-called flexible circuit board (FPC), flat cable, circuit board for tape-automated bonding (TAB) obtained by partially or entirely covering the conductor circuit made of metal foil using a cover film, screen printing ink and the like are collectively referred to as a printed wiring board.

The printed wiring board of the present invention can be configured to have an optional laminated structure that can be employed as a printed wiring board. For example, the printed wiring board can be formed of four layers including a base material film layer, a metal foil layer, an adhesive layer, and a cover film layer. For example, the printed wiring board can also be formed of five layers including a base material film layer, an adhesive layer, a metal foil layer, an adhesive layer, and a cover film layer. The printed wiring board may be reinforced by reinforcing members as appropriate, in which case the reinforcing member and the adhesive layer are provided below the base material film layer.

Furthermore, two or three or more printed wiring boards described above can also be laminated, as required.

The resin composition of the present invention can be suitably used for each adhesive layer of the printed wiring board. Particularly, when the resin composition of the present invention is used as an adhesive, this resin composition can be highly adhesive to the base material forming the printed wiring board, be excellent in heat resistance adaptable to lead-free solder, and maintain high adhesiveness even at a high temperature and high humidity. Since this resin composition can achieve a high crosslink density while maintaining a low storage elastic modulus particularly in the high temperature region in which the resistance to solder is evaluated, it is possible to fully alleviate the impact by moisture evaporation in the solder resistance test in the humidified state. Accordingly, the resin composition of the present invention is suitable for the adhesive between the metal foil layer and the cover film layer, and for adhesion between the base material film layer and the reinforcing member layer. Particularly when a rigid reinforcing member like an SUS plate is used, strong impact is applied to the adhesive layer between the base material film layer and the reinforcing member layer during soldering in the humidified state. Accordingly, the resin composition of the present invention is suitable for adhesion in that case.

In the printed wiring board of the present invention, an optional resin film that has been conventionally used as a base material of the printed wiring board can be used as a base material film. Resin of the base material film to be used may be resin including halogen or resin not including halogen. Although resin not including halogen is preferable in consideration of environmental issues, resin including halogen can also be used since it is flame retardant. The base material film is preferably a polyimide film or a polyamide-imide film.

As metal foil used in the present invention, it is possible to employ a conventionally well-known optional conductive material that can be used for a circuit board. The metal foil to be used may be, for example, made of copper foil, aluminum foil, steel foil, nickel foil, or the like, and also made of composite metal foil combined with these foils, or metal foil processed with other metals such as zinc and a chromium compound. The metal foil is preferably copper foil.

Although the thickness of the metal foil is not particularly limited, it is preferably not less than 1 µm, more preferably not less than 3 µm, and further preferably not less than 10 µm. Furthermore, the thickness of the metal foil is preferably not more than 50 µm, more preferably not more than 30 µm, further preferably not more than 20 µm. When the metal foil is too thin, sufficient electrical performance of the circuit may not be achieved. On the other hand, when the metal foil is too thick, the process efficiency and the like during production of the circuit may deteriorate.

The metal foil is normally provided in a rolled shape. The shape of the metal foil used when producing the printed wiring board of the present invention is not particularly limited. When the metal foil in a rolled shape is used, the length thereof is not particularly limited. The width is also not particularly limited, but preferably falls within the range of not less than 250 mm and not more than 500 mm.

A cover film that can be used may be an optional insulating film that is conventionally well known as an insulating film for a printed wiring board. For example, it is possible to employ a film made of various polymers such as polyimide, polyester, polyphenylene sulphide, polyether sulfone, polyetheretherketone, aramid, polycarbonate, polyarylate, polyimide, and polyamide-imide. More preferably, the film may be a polyimide film or a polyamide-imide film, and further preferably a polyimide film.

The polyimide film is made mainly of a polyimide resin as a resin component. Polyimide contained in the resin component is preferably not less than 90 percent by mass, more preferably not less than 95 percent by mass, further preferably not less than 98 percent by mass, and particularly preferably not less than 99 percent by mass. As a polyimide resin, conventionally well-known optional resins can be used.

Examples of the resin used as a material of the cover film may be a resin including halogen or a resin not including halogen. Although a resin not including halogen is preferable in view of environmental issues, a resin including halogen can also be used since it is flame retardant.

The reinforcing member to be used may be a metal plate such as an SUS plate and an aluminum plate, a plate obtained by curing a polyimide film or glass fiber with an epoxy resin, and the like.

The printed wiring board of the present invention can be produced using a conventionally well-known optional process except that the above-described material for each layer is used.

In the preferable embodiment, a semi-product having an adhesive layer laminated on a cover film layer (which will be hereinafter referred to as a "semi-product on the cover film side") is produced. In addition, a semi-product having a desired circuit pattern formed on a metal foil layer laminated on a base material film layer (which will be hereinafter referred to as a "two-layer semi-product on the base material film side"), or a semi-product having a desired circuit pattern formed on a metal foil layer laminated on an adhesive layer laminated on a base material film layer (which will be hereinafter referred to as a "three-layer semi-product on the base material film side") is produced (the two-layer semi-product on the base material film side and the three-layer semi-product on the base material film side will be hereinafter collectively referred to as a "semi-product on the base material film side"). The semi-product on the cover film side and the semi-product on the base material film side produced in this way are bonded together, so that a four-layer or five-layer printed wiring board can be implemented. Furthermore, a semi-product having an adhesive layer laminated on a reinforcing member layer (which will be hereinafter referred to as a "semi-product on the reinforcing member side") is produced and bonded to the base material film layer of the printed wiring board as appropriate for allowing reinforcement. Furthermore, the adhesive used between the reinforcing member and the base material film can be applied to the release base material, transferred onto the backside of the base material film of the printed wiring board, and bonded to the reinforcing member.

The semi-product on the base material film side can be obtained, for example, by a manufacturing method including 1) the process of applying a resin solution to be used as a base material film onto the above-described metal foil and pre-drying the coating film; and 2) the process of heat-treating and drying the laminated product made of the metal foil and the pre-dried coating film obtained in the process 1) (which will be hereinafter referred to as a "heat treatment/de-solvent process").

In order to form a circuit in the metal foil layer, conventionally well-known methods can be used. The active method or the subtractive method may be used. It is preferable to employ the subtractive method.

The obtained semi-product on the base material film side may be used for bonding to the semi-product on the cover film side as it is, or may be used for bonding to the semi-product on the cover film side after a release film is bonded thereto, which is then stored.

The semi-product on the cover film side is produced, for example, by applying an adhesive to the cover film. The crosslink reaction in the applied adhesive can be caused to occur as appropriate. In the preferable embodiment, the adhesive layer is semi-cured.

The obtained semi-product on the cover film side may be used for bonding to the semi-product on the base material side as it is, or may be used for bonding to the semi-product on the base material film side after a release film is bonded thereto, which is then stored.

After the semi-product on the base material film side and the semi-product on the cover film side each are stored, for example, in the shape of a roll, these products are bonded to each other to produce a printed wiring board. Any optional method can be used as the method of bonding these products, and for example, the products can be bonded by means of pressing, rolling or the like. Furthermore, these products can be bonded to each other while being heated by a method using a hot-pressing or hot-rolling apparatus.

For example, in the case where the semi-product on the reinforcing member side is made of a reinforcing member that is soft like a polyimide film and can be taken up, it is suitable that the semi-product on the reinforcing member side is produced by applying an adhesive to the reinforcing member. Furthermore, in the case where the semi-product on the reinforcing member side is made of a reinforcing plate that cannot be taken up since it is hard like a metal plate such as SUS and aluminum or a plate obtained by curing glass fiber with an epoxy resin, it is suitable that the semi-product on the reinforcing member side is produced by transferring and applying the adhesive that has been applied to the release base material in advance. Furthermore, the crosslink reaction in the applied adhesive can be caused to occur as appropriate. The adhesive layer is half-cured in the preferable embodiment.

The obtained semi-product on the reinforcing member side may be used for bonding to the backside of the printed wiring board as it is, or may be used for bonding to the semi-product on the base material film side after the release film is bonded thereto which is then stored.

The semi-product on the base material film side, the semi-product on the cover film side and the semi-product on the reinforcing member side each are a laminated body for a printed wiring board in the present invention.

EXAMPLES

The present invention will be hereinafter specifically described. The term "part" simply recited in each example denotes "part by mass".

(Physical Property Evaluation Method)

(1) Composition of Polyester Resin

A polyester resin was dissolved in deuterated chloroform, and the molar ratio of the acid component and the glycol component was calculated by $^1$H-NMR analysis.

(2) Number Average Molecular Weight Mn

The sample was dissolved and/or diluted by tetrahydrofuran such that the resin concentration was approximately 0.5 percent by mass, and filtered with a membrane filter made of polytetrafluoroethylene having a pore size of 0.5 μm to obtain a test sample, which was then used to measure the molecular weight by gel permeation chromatography using tetrahydrofuran as a mobile phase and a differential refractometer as a detector. The flow velocity was set at 1 mL/minute and the column temperature was set at 30° C. Used as a column was KF-802, 804L and 806L manufactured by Showa Denko K.K. Monodisperse polystyrene was used for the molecular weight standards.

(3) Glass Transition Temperature

First, 10 mg of a test sample was introduced into an aluminum pan which was hermetically sealed with the pressed lid. Then, a differential scanning calorimetric analyzer (DSC) DSC-200 manufactured by Seiko Instruments Inc. was used to make measurements at a temperature rising rate of 20° C./min and set the intersection, as a glass transition temperature, of the straight line extending from the baseline on the low temperature side to the high temperature side and the tangent line drawn at the largest gradient point of the curved line in the portion where the grass transition was changed in a step-wise manner.

(4) Acid Value

Then, 0.2 g of a sample was dissolved in 20 ml of chloroform and phenolphthalein was used as an indicator, to perform titration with a 0.1N potassium hydroxide ethanol solution and calculate the equivalent per $10^6$ g (equivalent/$10^6$ g) of the resin.

(5) Epoxy Value

In accordance with JIS K 7236, the equivalent per $10^6$ g (equivalent/$10^6$ g) of the resin was calculated from the epoxy equivalent (mass of the resin including a 1-equivalent epoxy group) obtained using the perchloric acid titration method.

(Characteristics Evaluation Method)

(1) Adhesiveness

The adhesive composition described later was applied to a polyimide film having a thickness of 25 μm (Apical manufactured by Kaneka Corporation) so as to have a thickness of 25 μm after dry, and then, dried at 130° C. for 3 minutes. Then, the plane on which the adhesive composition of the adhesive sheet obtained in this way and the SUS 304 plate of 500 μm were pressed together at 160° C. under pressure of 30 kgf/cm$^2$ for 1 minutes, and then, bonded to each other. Then, the resultant was heat-treated at 140° C. for 4 hours and cured to obtain a sample for peeling strength evaluation (sample for initial evaluation). Also, after the adhesive sheet has been left for 3 weeks at 40° C. under humidification at 80% relative humidity, pressing and heat treatment were performed in the same manner as with the case of the sample for initial evaluation except that the SUS 304 plate was replaced with rolled copper foil. Thus, samples for evaluation over time were obtained.

For these samples, RTM 100 manufactured by Toyo Baldwin Co., Ltd. was used to perform 180-degree peeling test under an atmosphere at 25° C. and at a tension rate of 50 mm/min, to evaluate the adhesive strength. This test shows the adhesive strength at ordinary temperatures. In consideration of the practical performance, the adhesive strength is preferably not less than 15 N/cm, and more preferably not less than 20 N/cm.

(2) Creep Characteristics

The resin composition for an adhesive described later was applied to a polyimide film having a thickness of 125 μm (Kapton manufacture by Du Pont-Toray Co., Ltd.) so as to have a thickness of 30 μm after dry, and then, dried at 130° C. for 3 minutes. The adhesive sheet obtained in this way was cut into 5-mm width. Then, the plane on which the resin composition for an adhesive was applied and the SUS 304 plate of 500 μm were pressed together for 30 seconds at 160° C. under pressure of 30 kgf/cm$^2$, and then bonded together. Then, the resultant was heat-treated at 140° C. for 4 hours and cured, to obtain a sample for creep characteristics evaluation (sample for initial evaluation). Furthermore, after the above-described adhesive sheet has been left for 14 days at 40° C. under humidification at 80% relative humidity, this adhesive sheet was pressed against the SUS 304 plate and heat-treated and cured in the same manner as with the sample for initial evaluation, to thereby obtain a sample for evaluation over time. One end of the obtained sample was peeled off from the SUS 304 plate, and a 200-gram weight was hung from this peeled end of the sample such that the sample was peeled away from the SUS 304 plate at an angle of 180°, which was then held for 30 minutes under an atmosphere at 60° C.×90%. The peeled length during this time period was measured. This test is to show the adhesive strength at a high temperature and high humidity. The less peeling is more preferable. The greater the peeling length is, the less the adhesive strength is.

(3) Outflow Characteristics (Press Suitability)

The outflow amount of the adhesive from the polyimide film of the sample for creep characteristics evaluation (sample for initial evaluation) described above was measured.

(Evaluation)
a: less than 0.15 mm,
b: not less than 0.15 mm and less than 0.3 mm,
c: not less than 0.3 mm.

(4) Low-Temperature Flexibility Test

The resin composition for an adhesive described later was applied to a polypropylene film of 50 μm thick (Pylen manufactured by Toyobo Co., Ltd) such that the dried composition has a thickness of 30 μm, and then dried at 130° C. for 3 minutes to obtain an adhesive sheet. After this adhesive sheet was left for 24 hours or more under an atmosphere at 5° C., it was bent still under an atmosphere at 5° C. such that the layer of the adhesive composition was located outside. Then, it was checked whether cracking and fracturing occurred or not. The adhesive sheet that does not crack or fracture can be suppressed from experiencing cracking or fracturing in the punching process and the slitting process during production, thereby allowing improvement in the workability even at a low temperature, so that the defective product rate can be lowered.

(Evaluation)
a: no cracking and fracturing,
b: cracked and fractured.

Polymerization Example of Polyester Resin A

First, 203 parts of terephthalic acid, 203 parts of isophthalic acid, 9.6 parts of trimellitic anhydride, 158 parts of ethylene glycol, 177 parts of neopentyl glycol, and 0.2 parts of tetrabutyl titanate were introduced into a reaction can provided with a stirrer, a thermometer and a cooler for outflows, and the temperature thereof was gradually raised to 250° C. for 4 hours. Then, an esterification reaction was performed while removing distilled water to the outside of the system. While performing pre-polymerization under reduced pressure to 10 mmHg for 30 minutes after completion of the esterification reaction, the temperature was raised to 250° C., and then, post-polymerization was further performed for 30 minutes at 1 mmHg or less. Then, the pressure was returned to the normal pressure by nitrogen, and 399 parts of ε-caprolactone was introduced to cause a reaction at 200° C. for 1 hour, thereby obtaining a polyester resin C. The composition and characteristic values of the polyester resin C obtained in this way are shown in Table 1. Each measurement evaluation item was based on the above-described method.

Polymerization Example of Polyester Resin B

First, 125 parts of terephthalic acid, 120 parts of isophthalic acid, 202 parts of sebacic acid, 4.8 parts of trimellitic anhydride, 311 parts of 2-methyl-1,3-propanediol, 140 parts of 1,4-butanediol, and 0.2 parts of tetrabutyl titanate were introduced into a reaction can provided with a stirrer, a thermometer and a cooler for outflows, and the temperature thereof was gradually raised to 230° C. for 4 hours. Then, an esterification reaction was performed while removing distilled water to the outside of the system. While performing pre-polymerization under reduced pressure to 10 mmHg for 30 minutes after completion of the esterification reaction, the temperature was raised to 240° C., and then, post-polymerization was further performed for 1 hour at 1 mmHg or less. Then, the pressure was returned to the normal pressure by nitrogen, and 4.8 parts of trimellitic anhydride was introduced to cause a reaction at 220° C. for 30 minutes, thereby obtaining a polyester resin A. The composition and characteristic values of polyester obtained in this way are shown in Table 1. Each measurement evaluation item was based on the above-described method.

Polymerization Example of Polyester Resins C, D, F, G, and I

Similarly to the polymerization examples of polyester resins A and B, the temperature and time were selected as appropriate, and the raw materials shown in Table 1 were used to obtain polyester resins C, D, F, G, and I. The compositions and the characteristic values of theses resins are shown in Table 1.

Polymerization Example of Polyester Resin E

First, 208 parts of terephthalic acid, 208 parts of isophthalic acid, 158 parts of ethylene glycol, 177 parts of neopentyl glycol, and 0.2 parts of tetrabutyl titanate were introduced into a reaction can provided with a stirrer, a thermometer and a cooler for outflows, and the temperature thereof was gradually raised to 240° C. for 4 hours. Then, an esterification reaction was performed while removing distilled water to the outside of the system. While performing pre-polymerization under reduced pressure to 10 mmHg for 30 minutes after completion of the esterification reaction, the temperature was raised to 250° C. Then, post-polymerization was further performed for 1 hour at 1 mmHg or less to obtain a polyester resin E. The composition and characteristic values of the polyester resin obtained in this way are shown in Table 1. Each measurement evaluation item was based on the above-described method.

Polymerization Example of Polyester Resin H

Similarly to the polymerization example of polyester resin E, the temperature and time were selected as appropriate, and the raw materials shown in Table 1 were used to obtain a polyester resin H. The composition and the characteristic values of this resin are shown in Table 1.

TABLE 1

| | Polyester Resin | | A | B | C | D | E | F | G | H | I |
|---|---|---|---|---|---|---|---|---|---|---|---|
| Composition Mol % | Polyvalent Carboxylic Acid Component | Terephthalic Acid | 49 | 30 | 49 | 50 | 50 | 40 | 29 | 50 | 35 |
| | | Isophthalic Acid | 49 | 29 | 49 | 49 | 50 | 39 | 70 | 50 | 34 |
| | | Adipic Acid | — | — | — | — | — | 20 | — | — | 30 |
| | | Sebacic Acid | — | 40 | — | — | — | — | — | — | — |
| | | Trimellitic Anhydride | 2 | 1 | 2 | 1 | — | 1 | 1 | — | 1 |
| | Polyhydric Alcohol Component | 2-Methyl-1,3-Propanediol | — | 69 | — | 83 | — | 58 | 30 | — | 58 |
| | | 1,4-Butanediol | — | 31 | — | 17 | — | 42 | 70 | — | 42 |
| | | 1,6-Hexanediol | — | — | — | — | — | — | — | — | — |

TABLE 1-continued

| Polyester Resin | | | A | B | C | D | E | F | G | H | I |
|---|---|---|---|---|---|---|---|---|---|---|---|
| | | Ethylene Glycol | 50 | — | 34 | — | 50 | — | — | 50 | — |
| | | Neopentyl Glycol | 50 | — | 50 | — | 50 | — | — | 50 | — |
| | | PTMG-1000 | — | — | 16 | — | — | — | — | — | — |
| | Lactones | ε-Caprolactone | 140 | — | — | — | — | — | — | — | — |
| | Added Acid | Trimellitic Anhydride | — | 1 | 2 | 1 | — | 4 | 1 | — | 1 |
| Physical | Number Average Molecular Weight (Mn) | | 28000 | 13800 | 27000 | 11500 | 12000 | 15000 | 13000 | 2000 | 1500 |
| Property | Acid Value (Equivalent/$10^6$ g) | | 10 | 90 | 100 | 90 | 10 | 400 | 90 | 10 | 90 |
| | Glass Transition Temperature (° C.) | | −20 | −19 | −76 | 40 | 67 | 10 | 25 | 57 | −5 |

Note:
PTMG-1000: Polytetramethylene ether glycol

Polymerization Example of Polyurethane Resin A

First, 650 parts of polyester resin D and 650 parts of toluene shown in Table 1 were introduced into a reaction can provided with a thermometer, a stirrer, a reflux cooling tube, and a distillation tube, and dissolved therein. Then, 413 parts of toluene was distilled to dehydrate the reaction system by azeotropy of toluene/water. Then, after having been cooled to 60° C., 29.3 parts of 2,2-dimethylol butanoic acid (DMBA) and 237 parts of methyl ethyl ketone were added. After the DMBA has been dissolved, 30.6 parts of hexamethylene diisocyanate and, as a reaction catalyst, 0.03 parts of diazabicyclo undecene (DBU) were added and reacted at 80° C. for 7 hours. Then, 444 parts of methyl ethyl ketone and 148 parts of toluene were introduced to adjust the solid content concentration at 40 percent by weight, to thereby obtain a polyurethane resin A solution. Using the film obtained by removing the solvent by drying the polyurethane resin A solution at 120° C. for 1 hour, measurements were made in accordance with each measurement evaluation item described above. The characteristics of the polyurethane resin are shown in Table 2.

Polymerization Example of Polyurethane Resins B, C, D, E, and F

Similarly to the polymerization example of polyurethane resin A, the raw materials shown in Table 2 were used to obtain polyurethane resins B, C, D, E, and F. The characteristic values are shown in Table 2. Each measurement evaluation item was based on the above-described method.

Example 1

First, 95 parts of polyurethane resin A (mass of solid content only and no solvent contained; the same applies in the following), 5 parts of polyester resin A, 15.11 parts of epoxy resin A [HP7200-H (dicyclopentane diene-type epoxy resin) manufactured by Dainippon Ink & Chemicals, Inc., epoxy value=3540 equivalents/$10^6$ g], and 0.43 parts of epoxy resin B [TETRAD-X (N,N,N',N'-tetra-glycidyl-m-xylene diamine) manufactured by Mitsubishi Gas Chemical Company, Inc.), epoxy value=10000 equivalents/$10^6$ g] were blended to obtain a targeted resin composition for an adhesive. It is to be noted that the epoxy resin was blended as a MEK 70% solution. The amount of blending the epoxy resin was determined by making a calculation so as to include glycidyl groups that are 1.6 times greater than the total amount of the acid values of polyurethane resin A and polyester resin A. The adhesion evaluation sample was produced by the above-described method, and the evaluated results are shown in Table 3. Both the initial evaluation and the evaluation over time show favorable results. Furthermore, the results of the outflow characteristics and the low temperature flexibility are also excellent.

Examples 2 to 12

As with Example 1, samples were produced using the types of resin in each blending amount shown in Tables 3 and 4, to evaluate the resin characteristics. Epoxy resin C is YDCN 703 (o-cresol novolak-type epoxy resin, epoxy value=4651, equivalents/$10^6$ g]) manufactured by Tohto Kasei Co, Ltd. The evaluated results are shown in Tables 3 and 4. The results of the initial evaluation and the evaluation over time are excellent. The results of the outflow characteristics and the low temperature flexibility are also excellent.

TABLE 2

| | Polyurethane Resin | | A | B | C | D | E | F |
|---|---|---|---|---|---|---|---|---|
| Composition | Polyester Resin | D | 100 | — | 100 | — | — | — |
| Parts by Mass | (Polyester Polyol) | E | — | 100 | — | 100 | — | — |
| | | G | — | — | — | — | 100 | — |
| | | H | — | — | — | — | — | 100 |
| | Chain Extender | DMBA | 4.5 | 9 | 22 | — | 9 | 9 |
| | | NPG | — | — | — | 3.2 | — | — |
| | Diisocyanate | HDI | 4.7 | 8.2 | 18 | 4.5 | 8.2 | 1 |
| Characteristics | Number Average Molecular Weight (Mn) | | 22000 | 18000 | 18000 | 15000 | 17000 | 4500 |
| | Acid Value (Equivalent/$10^6$ g) | | 380 | 650 | 1150 | 80 | 650 | 670 |
| | Glass Transition Temperature (° C.) | | 40 | 65 | 45 | 65 | 25 | 65 |

Note:
DMBA: 2,2-dimethylol butanoic acid
NPG: Neopentyl glycol
HDI: hexamethylene diisocyanate

TABLE 3

|  |  |  | Examples | | | | | |
| --- | --- | --- | --- | --- | --- | --- | --- | --- |
|  |  |  | 1 | 2 | 3 | 4 | 5 | 6 |
| Composition | Polyurethane Resin | Composition | A | A | A | A | A | B |
|  |  | Parts by Mass (solid content) | 95 | 92.5 | 90 | 90 | 85 | 95 |
|  | Polyester Resin | Composition | A | A | A | B | A | C |
|  |  | Parts by Mass (solid content) | 5 | 7.5 | 10 | 10 | 15 | 5 |
|  | Epoxy Resin | A Parts by Mass (solid content) | 15.11 | 13.85 | 13.49 | 11.21 | 11.02 | 26.03 |
|  |  | B Parts by Mass (solid content) | 0.43 | 0.73 | 0.71 | 0.59 | 0.32 | 0.75 |
|  |  | C Parts by Mass (solid content) | — | — | — | — | — | — |
|  | Concentration of epoxy resin containing nitrogen atoms in epoxy resin (mass %) |  | 2.8 | 5.0 | 5.0 | 5.0 | 2.8 | 2.8 |
| Characteristics | Peeling Strength (N/Cm) | Initial | 17 | >25 | >25 | >25 | 23 | 20 |
|  |  | After having been left for 3 weeks at 40° C. in 80% RH | 17 | 21 | 23 | 24 | 20 | 18 |
|  | Creep Characteristics (Mm) | Initial | 1 | 2 | 3 | 2 | 3 | 0 |
|  |  | After having been left for 3 weeks at 40° C. in 80% RH | 1 | 2 | 3 | 3 | 4 | 0 |
|  | Outflow Amount | Evaluation | a | a | a | a | b | a |
|  | Low-Temperature Flexibility Test | Evaluation | b | a | a | a | a | b |

Epoxy resin A: HP7200-H (dicyclopentane diene-type epoxy resin) manufactured by Dainippon Ink Industry Co., Ltd.
Epoxy resin B: TETRAD-X (N,N,N',N'-tetra-glycidyl-m-xylene diamine) manufactured by Mitsubishi Gas Chemical Co., Inc.
Epoxy resin C: YDCN703 (o-cresol novolak-type epoxy resin) manufactured by Tohto Kasei Co., Ltd.

TABLE 4

|  |  |  | Examples | | | | | |
| --- | --- | --- | --- | --- | --- | --- | --- | --- |
|  |  |  | 7 | 8 | 9 | 10 | 11 | 12 |
| Composition | Polyurethane Resin | Composition | B | B | B | B | B | A |
|  |  | Parts by Mass (solid content) | 92.5 | 90 | 85 | 85 | 75 | 90 |
|  | Polyester Resin | Composition | C | C | C | A | C | A |
|  |  | Parts by Mass (solid content) | 7.5 | 10 | 15 | 15 | 25 | 10 |
|  | Epoxy Resin | A Parts by Mass (solid content) | 25.45 | 24.88 | 22.32 | 27.23 | 23.16 | 11.63 |
|  |  | B Parts by Mass (solid content) | 0.73 | 0.71 | 1.18 | 1.44 | 2.05 | 0.44 |
|  |  | C Parts by Mass (solid content) | — | — | — | — | — | 2.01 |
|  | Concentration of epoxy resin containing nitrogen atoms in epoxy resin (mass %) |  | 2.8 | 2.8 | 5.0 | 5.0 | 8.1 | 3.1 |
| Characteristics | Peeling Strength (N/cm) | Initial | 20 | 23 | >25 | 18 | 16 | 21 |
|  |  | After having been left for 3 weeks at 40° C. in 80% RH | 19 | 23 | 17 | 16 | 15 | 19 |
|  | Creep Characteristics (mm) | Initial | 0 | 0 | 7 | 6 | 9 | 3 |
|  |  | After having been left for 3 weeks at 40° C. in 80% RH | 0 | 0 | 9 | 9 | 10 | 3 |
|  | Outflow Amount | Evaluation | a | a | a | a | a | b |
|  | Low-Temperature Flexibility Test | Evaluation | a | a | a | a | a | a |

Epoxy resin A: HP7200-H (dicyclopentane diene-type epoxy resin) manufactured by Dainippon Ink Industry Co., Ltd.
Epoxy resin B: TETRAD-X (N,N,N',N'-tetra-glycidyl-m-xylene diamine) manufactured by Mitsubishi Gas Chemical Co., Inc.
Epoxy resin C: YDCN703 (o-cresol novolak-type epoxy resin) manufactured by Tohto Kasei Co., Ltd.

Comparative Examples 1 to 12

As with Examples 1 to 12, samples were produced using the types of resin in each blending amount shown in Tables 5 and 6, to evaluate the resin characteristics.

TABLE 5

|  |  |  | Comparative Example | | | | | |
| --- | --- | --- | --- | --- | --- | --- | --- | --- |
|  |  |  | 1 | 2 | 3 | 4 | 5 | 6 |
| Composition | Polyurethane Resin | Composition | A | A | A | B | B | B |
|  |  | Parts by Mass (solid content) | 100 | 90 | 90 | 65 | 85 | 90 |
|  | Polyester Resin | Composition | B | B | F | C | A | C |
|  |  | Parts by Mass (solid content) | 0 | 10 | 10 | 35 | 15 | 10 |
|  | Epoxy Resin | A Parts by Mass (solid content) | 14.94 | 15.86 | 15.02 | 19.13 | — | 38.87 |
|  |  | B Parts by Mass (solid content) | 0.79 | — | 0.79 | 0.55 | 1.13 | 1.12 |
|  |  | C Parts by Mass (solid content) | — | — | — | — | 21.39 | — |
|  | Concentration of epoxy resin containing nitrogen atoms in epoxy resin (mass %) |  | 5.0 | 0.0 | 5.0 | 2.8 | 5.0 | 2.8 |

TABLE 5-continued

|  |  |  | Comparative Example | | | | | |
|---|---|---|---|---|---|---|---|---|
|  |  |  | 1 | 2 | 3 | 4 | 5 | 6 |
| Characteristics | Peeling Strength (N/cm) | Initial | 20 | >25 | >25 | 13 | 9 | 20 |
|  |  | After having been left for 3 weeks at 40° C. in 80% RH | 18 | 24 | 22 | 10 | 8 | 9 |
|  | Creep Characteristics (mm) | Initial | 2 | 1 | 3 | 6 | >40 | 20 |
|  |  | After having been left for 3 weeks at 40° C. in 80% RH | 2 | 1 | 4 | 15 | >40 | >40 |
|  | Outflow Amount | Evaluation | a | c | a | c | a | a |
|  | Low-Temperature Flexibility Test | Evaluation | c | a | c | a | a | a |

Epoxy resin A: HP7200-H (dicyclopentane diene-type epoxy resin) manufactured by Dainippon Ink Industry Co., Ltd.
Epoxy resin B: TETRAD-X (N,N,N',N'-tetra-glycidyl-m-xylene diamine) manufactured by Mitsubishi Gas Chemical Co., Inc.
Epoxy resin C: YDCN703 (o-cresol novolak-type epoxy resin) manufactured by Tohto Kasei Co., Ltd.

TABLE 6

|  |  |  | Comparative Example | | | | | |
|---|---|---|---|---|---|---|---|---|
|  |  |  | 7 | 8 | 9 | 10 | 11 | 12 |
| Composition | Polyurethane Resin | Composition | A | E | C | D | F | A |
|  |  | Parts by Mass (solid content) | 90 | 85 | 90 | 90 | 90 | 75 |
|  | Polyester Resin | Composition | B | A | B | A | A | I |
|  |  | Parts by Mass (solid content) | 10 | 15 | 10 | 10 | 10 | 25 |
|  | Epoxy Resin | A Parts by Mass (solid content) | 7.09 | 21.78 | 25.66 | 2.87 | 23.75 | 12.09 |
|  |  | B Parts by Mass (solid content) | 2.05 | 1.15 | 1.36 | 0.15 | 1.26 | 0.64 |
|  |  | C Parts by Mass (solid content) | — | — | — | — | — | — |
|  | Concentration of epoxy resin containing nitrogen atoms in epoxy resin (mass %) |  | 22.5 | 5.0 | 22.5 | 5.0 | 5.0 | 5.0 |
| Characteristics | Peeling Strength (N/cm) | Initial | 12 | 15 | 12 | 8 | 9 | 15 |
|  |  | After having been left for 3 weeks at 40° C. in 80% RH | 5 | 7 | 6 | 8 | 7 | 14 |
|  | Creep Characteristics (mm) | Initial | >40 | >40 | 25 | >40 | >40 | 15 |
|  |  | After having been left for 3 weeks at 40° C. in 80% RH | >40 | >40 | >40 | >40 | >40 | 15 |
|  | Outflow Amount | Evaluation | a | a | a | c | a | c |
|  | Low-Temperature Flexibility Test | Evaluation | a | a | a | a | a | a |

Epoxy resin A: HP7200-H (dicyclopentane diene-type epoxy resin) manufactured by Dainippon Ink Industry Co., Ltd.
Epoxy resin B: TETRAD-X (N,N,N',N'-tetra-glycidyl-m-xylene diamine) manufactured by Mitsubishi Gas Chemical Co., Inc.
Epoxy resin C: YDCN703 (o-cresol novolak-type epoxy resin) manufactured by Tohto Kasei Co., Ltd.

In Comparative Example 1, the polyester resin having a glass transition temperature of 0° C. or less was not blended, which is beyond the scope of the present invention. In this case, the flexibility is insufficient while the low temperature flexibility is poor.

In comparative example 2, the epoxy resin containing nitrogen was not blended, which is beyond the scope of the present invention. In this case, the fluidity of the adhesive sheet is relatively high while the result of the outflow characteristics is not good.

In Comparative Example 3, the glass transition temperature of the blended polyester resin is high, which is beyond the scope of the present invention. In this case, the flexibility is insufficient while the low temperature flexibility is poor.

In Comparative Example 4, a relatively large amount of polyester resin is blended, which is beyond the scope of the present invention. In this case, the cohesive force is decreased, which leads to poor peeling strength. Furthermore, the heat resistance of the adhesive sheet is relatively low while the result of the outflow characteristics is not good.

In Comparative Example 5, the epoxy resin having a dicyclopentadiene skeleton is not blended, which is beyond the scope of the present invention. Since the crosslink density of the cured coating film is increased and the ability to alleviate the stress during peeling is reduced, the peeling strength becomes low and the hygroscopicity is increased, with the result that the creep characteristics used as an indicator of adhesiveness at a high temperature and high humidity is also poor.

In Comparative Example 6, a relatively large amount of epoxy resin is blended, which is beyond the scope of the present invention. In this case, the reactivity is relatively high while the stability of the adhesive sheet is poor, and thus, the peeling strength and the creep characteristics are significantly deteriorated with time.

In Comparative Example 7, a relatively large amount of epoxy resin is blended, which is beyond the scope of the present invention. In this case, the stiffness is excessively increased, so that both of the creep characteristics and the peeling strength at a room temperature are poor.

In Comparative Example 8, the glass transition temperature of the polyurethane resin is relatively low, which is beyond the scope of the present invention. In this case, the heat resistance is low, thereby leading to poor creep characteristics. Also, the stability of the adhesive sheet is poor, so that the peeling strength at a room temperature is significantly decreased with time.

In Comparative Example 9, the acid value of the polyurethane resin is relatively large, which is beyond the scope of the present invention. Since the stiffness of the cured product is excessively high, the peeling strength at a room temperature is low while the creep characteristics used as an indicator of adhesiveness at a high temperature and high humidity is also poor.

In comparative example 10, the acid value of the polyurethane resin is relatively small, which is beyond the scope of the present invention. In this case, since the cured product is insufficiently crosslinked, to thereby cause a decrease in the cohesive force and the heat resistance, both the peeling strength and the creep characteristics are poor. Furthermore, the fluidity of the adhesive sheet is relatively high while the result of the outflow characteristics is not good.

In Comparative Example 11, the molecular weight of the polyurethane resin is relatively low, which is beyond the scope of the present invention. Since the flexibility is relatively low, the peeling strength at a room temperature is low while the creep characteristics used as an indicator of adhesiveness at a high temperature and high humidity is also poor.

In Comparative Example 12, the molecular weight of the blended polyester resin is relatively low, which is beyond the scope of the present invention. In this case, the heat resistance becomes insufficient, and the results of both the outflow characteristics and the creep characteristics are not good.

Comparative Example 13

Similarly to Synthesis Examples 1 and 5 in PTL 4, a polyester resin 1 and a polyester resin 2 were synthesized. The obtained polyester resin 1 and polyester resin 2 were used to obtain a disperse solution (adhesive) in the same manner as with Example 1 in PTL 4.

<Synthesis of Polyester Resin 1>

First, 83 parts of terephthalic acid, 81 parts of isophthalic acid, 2 parts of trimellitic anhydride, 77 parts of ethylene glycol, and 79 parts of neopentyl glycol were introduced into a reaction can provided with a stirrer, a thermometer and a cooler for outflows, and the temperature thereof was gradually raised to 230° C. for 4 hours under pressure. Then, an esterification reaction was performed while removing distilled water to the outside of the system. Then, 0.08 parts of tetrabutyl titanate as a polymerization catalyst was introduced and stirred for 10 minutes at normal pressure. Subsequently, while performing pre-polymerization under reduced pressure to 10 mmHg for 1 hour, the temperature was raised to 250° C., and then, post-polymerization was further performed for 30 minutes at 1 mmHg or less. Then, after the resultant was cooled to 200° C. under a nitrogen atmosphere, 2 parts of trimellitic anhydride was introduced and stirred for 30 minutes, to obtain polyester resin 1. The characteristic values of polyester resin 1 obtained in this way are shown in the following. Each measurement evaluation item was based on the above-described method.

Number average molecular weight: 14000,
Acid value: 100 equivalents/$10^6$ g,
Glass transition temperature: 60° C.,
Resin composition: terephthalic acid/isophthalic acid/trimellitic acid//ethylene glycol/neopentyl glycol///trimellitic acid=50/49/1//50/50///1 (molar ratio).

<Synthesis of Polyester Resin 2>

First, 105 parts of terephthalic acid, 17 parts of isophthalic acid, 55 parts of sebacic acid, 90 parts of ethylene glycol, and 68 parts of neopentyl glycol were introduced into a reaction can provided with a stirrer, a thermometer and a cooler for outflows, and the temperature thereof was gradually raised to 230° C. for 4 hours. Then, an esterification reaction was performed while removing distilled water to the outside of the system. Then, 0.08 parts of tetrabutyl titanate was introduced as a polymerization catalyst and stirred for 10 minutes at normal pressure. Subsequently, while performing pre-polymerization under reduced pressure to 10 mmHg for 1 hour, the temperature was raised to 250° C., and then, post-polymerization was further performed for 30 minutes at 1 mmHg or less to obtain a polyester resin 2. The characteristic values of polyester resin 2 obtained in this way are shown in the following. Each measurement evaluation item was based on the above-described method.

Number average molecular weight: 30000,
Acid value: 40 equivalents/$10^6$ g,
Glass transition temperature: 10° C.,
Resin composition: terephthalic acid/isophthalic acid/sebacic acid//ethylene glycol/neopentyl glycol=63/10/27//58/42 (molar ratio).

<Production of Disperse Solution (Adhesive)>

Obtained polyester resin 1 and polyester resin 2 were dissolved in methyl ethyl ketone/toluene=1/4 (weight ratio) such that each solid content concentration was 30%. Then, 100 parts, in solid content, of these dissolved polyester resins (polyester resin 1/polyester resin 2=28/72 [weight ratio]), 50 parts of decabromodiphenyl ether, 36 parts of antimony trioxide, 14 parts of titanium dioxide, 4 parts of silicon dioxide, and 100 parts of glass beads were introduced into a 250-ml mayonnaise bottle, and dispersed for 6 hours by a shaker, to thereby obtain a disperse solution.

<Adhesive Characteristics Evaluation of Disperse Solution (Adhesive)>

The obtained disperse solution was evaluated in accordance with the above-described characteristics evaluation method. The evaluation results are shown in the following.

Peeling Strength
Initial: 8 N/cm
After having been left for 3 weeks at 40° C. in 80% RH: 7 N/cm
Creep Characteristics
Initial: >40 mm
After having been left for 3 weeks at 40° C. in 80% RH: >40 mm
Outflow Amount
Evaluation result: no good
Low-Temperature Flexibility Test
Evaluation result: no good In Comparative Example 13, since the polyurethane resin is not contained and the cohesive force is relatively low, the results about the peeling strength and the outflow amount are not good. Furthermore, the epoxy resin is not blended, which leads to a non-crosslinking (thermoplastic) coating film, with the result that the heat resistance is low and the creep characteristics are also poor. In addition, the glass transition temperature of the blended polyester resin is relatively high, thereby leading to insufficient flexibility and poor low-temperature flexibility.

INDUSTRIAL APPLICABILITY

According to the present invention, it becomes possible to achieve an adhesive that is excellent in adhesiveness to various plastic films, adhesiveness to metal such as copper, aluminum and stainless steel, adhesiveness to glass epoxy, and adhesiveness at a high temperature and high humidity, and excellent in the processing suitability during production, and also possible to provide a resin composition allowing an adhesive sheet to have a relatively long life, an adhesive containing the resin composition, an adhesive sheet containing the resin composition, and a printed wiring board including the adhesive or the adhesive sheet as an adhesive layer.

The invention claimed is:

1. A resin composition for an adhesive, comprising:
a polyurethane resin (a-1) containing a carboxyl group, having an acid value of not less than 100 equivalent/$10^6$ g and not more than 1000 equivalent/$10^6$ g, having a number average molecular weight of not less than $5.0 \times 10^3$ and not more than $1.0 \times 10^5$, and having a glass transition temperature of 30° C. or more and 80° C. or less;

a polyester resin (a-2) having a number average molecular weight of not less than $5.0 \times 10^3$ and not more than $1.0 \times 10^5$ and having a glass transition temperature of −5° C. or less;

an epoxy resin (b) containing a nitrogen atom; and an epoxy resin (c) having a dicyclopentadiene skeleton, wherein a content rate of said polyurethane resin (a-1) to a sum of said polyurethane resin (a-1) and said polyester resin (a-2) is not less than 70 percent by mass and not more than 95 percent by mass, a content rate of the total epoxy resin contained in the resin composition to the sum of said polyurethane resin (a-1) and said polyester resin (a-2) is not less than 5 percent by mass and not more than 30 percent by mass, and a blending ratio of said epoxy resin (b) is not less than 0.1 percent by mass and not more than 20 percent by mass of the total epoxy resin contained in the resin composition.

2. The resin composition for an adhesive according to claim 1, wherein said epoxy resin (b) has a glycidyl diamine structure.

3. The resin composition for an adhesive according to claim 1, wherein a blending ratio of said epoxy resin (c) is not less than 60 percent by mass and not more than 99.9 percent by mass of the total epoxy resin contained in the resin composition.

4. The resin composition for an adhesive according to claim 1, wherein said polyurethane resin (a-1) is obtained by a reaction of
polyester polyol (d),
a compound (e) having one carboxylic acid group and two hydroxyl groups, and
polyisocyanate (f).

5. The resin composition for an adhesive according to claim 1, further containing an organic solvent.

6. An adhesive containing the resin composition for an adhesive according to claim 1.

7. An adhesive sheet containing the resin composition for an adhesive according to claim 1.

8. A printed wiring board including an adhesive layer made of the resin composition for an adhesive according to claim 1.

* * * * *